(12) United States Patent
Wolf et al.

(10) Patent No.: US 7,116,106 B1
(45) Date of Patent: Oct. 3, 2006

(54) PROCESS AND SYSTEM FOR DETECTING AND CORRECTING ERRORS IN AN MRI SCAN PROCESS

(75) Inventors: Robert Wolf, Medford, NY (US); Godfrey Vassallo, Northport, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/991,134

(22) Filed: Nov. 16, 2004

(51) Int. Cl.
*G01V 3/00* (2006.01)

(52) U.S. Cl. ...................................... 324/314

(58) Field of Classification Search ............... 324/314, 324/307
See application file for complete search history.

(56) References Cited

U.S. PATENT DOCUMENTS

| | | | | |
|---|---|---|---|---|
| 4,625,170 A | * | 11/1986 | Yamamoto et al. | 324/309 |
| 4,682,108 A | * | 7/1987 | Stetter et al. | 324/309 |
| 5,427,101 A | * | 6/1995 | Sachs et al. | 600/410 |
| 6,426,623 B1 | * | 7/2002 | Bernstein | 324/314 |
| 6,522,139 B1 | * | 2/2003 | Thompson et al. | 324/307 |
| 6,704,594 B1 | * | 3/2004 | Blank et al. | 600/423 |
| 6,762,605 B1 | * | 7/2004 | Brinker et al. | 324/309 |
| 6,833,702 B1 | * | 12/2004 | Linardos et al. | 324/309 |
| 6,904,161 B1 | * | 6/2005 | Becker et al. | 382/128 |
| 2005/0001618 A1 | * | 1/2005 | Bydder | 324/307 |

* cited by examiner

*Primary Examiner*—Diego Gutierrez
*Assistant Examiner*—Jeremiah Shipman
(74) *Attorney, Agent, or Firm*—IP Strategies

(57) ABSTRACT

An MRI pulse sequence control system includes a pulse sequence controller, a controller, and a performance monitor module. The pulse sequence controller generates pulse sequence control data. The controller controls scanner devices according to the control data. The performance monitor module monitors performance of the controller during an MRI scanning procedure and provides controller performance information to the pulse sequence controller. The pulse sequence controller modifies the control data in response to the controller performance information. The controller responds to the control data during the MRI scanning procedure. A process for detecting errors in an MRI scan process includes monitoring performance of the controller during the MRI scanning procedure. Controller performance information is provided to the scanning pulse sequence controller. Control data generated by the scanning pulse sequence controller is modified in response to the controller performance information. The controller responds to the control data during the MRI scanning procedure.

126 Claims, 9 Drawing Sheets

PROCESS AND SYSTEM FOR DETECTING AND CORRECTING ERRORS IN AN MRI SCAN PROCESS

FIELD OF THE INVENTION

The present invention relates generally to MRI scanning equipment and processes. More particularly, the present invention relates to processes and devices that provide a more effective way of identifying and correcting errors and eliminating artifacts in an MRI scanning procedure.

BACKGROUND OF THE INVENTION

An MRI scanning procedure requires a coordinated effort among many pieces of hardware and software. Collection of scan data and production of images from the scan data must be carried out with precision if the resulting images are to have diagnostic value. Glitches in the procedure, due to hardware fatigue, software malfunction, electrical noise, temperature effects, or any other deviation by any operational parameter outside of an acceptable tolerance can have a negative effect on the results.

For example, timing problems in pulse sequence hardware and firmware can cause image artifacts due to shifting of pulse sequence waveforms. In a typical MRI scanner a pulse sequence system governs the timing and control of scanning devices. A stream of control data, typically generated by software on a PC, is transferred to a controller that times the provision of data to the various devices. Often, an intermediate processor receives the control data in a stream, buffers the control data, and provides blocks of the control data to the controller, which typically is hardware that resides on a circuit board.

The timing of the data transfer to the controller is determined by interrupts generated by the controller and provided to the intermediate processor. Occasionally, timing aberrations in the interrupt sequence result in device miscues, which in turn result in artifacts in the resulting image. If the timing errors are not detected, or if they are only reported at the end of a scan procedure, the artifacts will be present in the images, and the scan procedure might have to be repeated.

It would be advantageous to detect operational parameter deviations and other errors during the course of the scan procedure. It would also be advantageous to provide a report of these errors, and to act on the report during the scan procedure to correct portions of the scan procedure sequence while the procedure is taking place, so that the resulting image will be sufficient for diagnostic use.

SUMMARY OF THE INVENTION

The present invention provides a process by which errors in the scan process can be detected during the scan procedure, and information related to the scan error can be provided to the pulse sequence program while the scan procedure is taking place, so that control data can be modified accordingly during the course of the scan. The present invention also provides a system for carrying out such a process, and a performance monitor module for use in a conventional MRI pulse sequence control system.

According to an aspect of the present invention, a process for detecting errors in an MRI scan process includes monitoring performance of an MRI device controller during an MRI scanning procedure. MRI device controller performance information is provided to an MRI scanning pulse sequence controller, which can include, for example, a software module. Control data generated by the MRI scanning pulse sequence controller is modified in response to the MRI device controller performance information. The MRI device controller responds to the modified control data during the MRI scanning procedure.

Monitoring performance of the MRI device controller during the MRI scanning procedure can include, for example, monitoring fatal errors at the MRI device controller. In this example, providing MRI device controller performance information to the MRI scanning pulse sequence controller can include notifying the MRI scanning pulse sequence controller that a fatal error has occurred. Modifying the control data can then include generating control data terminating the MRI scanning procedure, and responding to the modified control data can include terminating the scanning procedure.

Alternatively, monitoring performance of the MRI device controller during the MRI scanning procedure can include monitoring at least one designated performance parameter of the MRI device controller, such as, for example, a scheduled repeating performance parameter. This scheduled repeating performance parameter can be a periodic parameter, or a parameter that repeats according to a non-periodic schedule. In such a case, monitoring the designated performance parameter at the MRI device controller can include monitoring the timing of the performance parameter, or monitoring performance counters tracking occurrences of the performance parameter.

One example of a performance parameter is an interrupt to a pulse sequence data buffer or other component of the MRI scan system. This interrupt can be a scheduled repeating interrupt, such as a periodic interrupt. In this case, monitoring the designated performance parameter at the MRI device controller can include monitoring the timing of the interrupt, or monitoring performance counters tracking occurrences of the interrupt.

The process can include determining that an error exists with respect to a monitored designated performance parameter, and repeating a portion of the MRI scan process corresponding to the determined error. The determined error can be, for example, a timing error. The portion of the MRI scan process corresponding to the determined error can include a predetermined number of sequences of the MRI scan process that occurred prior to determining that the error exists. These sequences can be, for example, numbers of outer phase encode levels. In addition, MRI scan data corresponding to the determined error can be deleted, or that data can be replaced with MRI scan data obtained when repeating the portion of the MRI scan process corresponding to the determined error. The process can also include causing the MRI device controller to reset MRI scanner hardware. The number of errors that are determined during the MRI scan process can be counted, and the MRI scan process can be terminated if the counted number of determined errors is equal to a predetermined error threshold.

Providing MRI device controller performance information to the MRI scanning pulse sequence controller can include sending an error message to the MRI scanning pulse sequence controller if timing of the designated performance parameter varies from a parameter timing schedule by more than a designated tolerance. In this case, modifying the control data generated by the MRI scanning pulse sequence controller in response to the MRI device controller performance information can include causing the MRI scanning pulse sequence controller to generate control data instructing a hardware reset, and responding to the modified control data can include causing the MRI device controller to reset MRI scan process hardware. The process can also include causing a counter that increments a sequence of the MRI scan process to hold a count while the MRI device controller resets the MRI scan process hardware, or causing the counter to decrement a predetermined number of counts while the MRI device controller resets the MRI scan process hardware.

According to another aspect of the present invention, a computer-readable medium can include instructions that are executable by a processor for causing the processor to carry out any aspects of the process described above.

According to another aspect of the present invention, an MRI pulse sequence control system includes an MRI pulse sequence controller, an MRI device controller, and a performance monitor module. The MRI pulse sequence controller generates pulse sequence control data. The MRI device controller controls MRI scanner devices in accordance with the control data. The performance monitor module monitors performance of the MRI device controller during an MRI scanning procedure and provides MRI device controller performance information to the MRI pulse sequence controller. The MRI pulse sequence controller modifies the control data in response to the MRI device controller performance information. The MRI device controller responds to the modified control data during the MRI scanning procedure.

For example, the performance of the MRI device controller during the MRI scanning procedure can include the occurrence of a fatal error at the MRI device controller. In this case, the MRI device controller performance information can include notification of the fatal error, and the modified control data can include control data requesting termination of the MRI scanning procedure. The MRI device controller can respond to the modified control data by terminating the scanning procedure.

As another example, the performance of the MRI device controller during the MRI scanning procedure can include the status of at least one designated performance parameter of the MRI device controller. The designated performance parameter can be, for example, a scheduled repeating performance parameter, such as a periodic parameter. In this case, the designated performance parameter can include timing of the scheduled repeating performance parameter. For example, the performance monitor module can include performance counters tracking occurrences of the performance parameter, and the designated performance parameter of the MRI device controller can include output values of the performance counters.

The system of the present invention can also include a pulse sequence data buffer, and the performance parameter can include an interrupt to the pulse sequence data buffer. For example, the interrupt can be a scheduled repeating interrupt, such as a periodic interrupt. The designated performance parameter of the MRI device controller can include the timing of the interrupt. The performance monitor module can include performance counters tracking occurrences of the interrupt, and the designated performance parameter of the MRI device controller can include output values of the performance counters.

When the performance monitor module determines that an error exists with respect to a monitored designated performance parameter, the MRI pulse sequence controller can repeat a portion of the MRI scan process corresponding to the determined error. The determined error can be, for example, a timing error. The portion of the MRI scan process corresponding to the determined error can include a predetermined number of sequences of the MRI scan process that occurred prior to determining that the error exists. The sequences can be, for example, numbers of outer phase encode levels. In addition, the MRI pulse sequence controller can delete MRI scan data corresponding to the determined error, or replace MRI scan data corresponding to the determined error with MRI scan data obtained when repeating the portion of the MRI scan process corresponding to the determined error. The MRI pulse sequence controller can also cause the MRI device controller to reset MRI scanner hardware. Further, the performance monitor module can count a number of errors that are determined during the MRI scan process, and the MRI pulse sequence controller can terminate the MRI scan process if the counted number of determined errors is equal to a predetermined error threshold.

The performance monitor module can send an error message to the MRI scanning pulse sequence controller if timing of the designated performance parameter varies from a parameter timing schedule by more than a designated tolerance. In that case, the MRI scanning pulse sequence controller can generate control data instructing a hardware reset in response to the error message, causing the MRI device controller to reset MRI scan process hardware. The MRI pulse sequence controller can include a counter that increments a sequence of the MRI scan process when no error message is received, and holds a count while the MRI device controller resets the MRI scan process hardware in response to the error message. Alternatively, the counter can decrement a predetermined number of counts while the MRI device controller resets the MRI scan process hardware.

The MRI pulse sequence controller can be a component of a personal computer, and can include any appropriate hardware component, such as a microprocessor, an ASIC, or an FPGA, and/or can include software that is executed by processor hardware, or firmware executed by processor hardware. The firmware can be stored, for example, on a ROM device.

The performance monitor module can include a microprocessor, an ASIC, an FPGA, software that is executed by processor hardware, firmware executed by processor hardware, or discrete circuitry and/or firmware mounted on a printed circuit board. The firmware can be stored, for example, on a ROM device. Further, the performance monitor module can be fabricated or assembled as a unit with the MRI device controller.

The system of the invention can also include an intermediate processor that passes control data from the MRI pulse sequence controller to the MRI device controller. For example, the intermediate processor can pass the MRI device controller performance information to the MRI pulse sequence controller. The intermediate processor can also include data buffers that buffer at least some data passing between the MRI pulse sequence controller and the MRI device controller. Further, the performance monitor module can be fabricated or assembled as a unit with the intermediate processor, or can be included as part of the intermediate processor.

According to another aspect of the present invention, a performance monitor module is adapted for use in an MRI pulse sequence control system that includes an MRI pulse sequence controller that generates pulse sequence control data and an MRI device controller that controls MRI scanner devices in accordance with the control data. The performance monitor module includes a detection sub-module and a report sub-module. The detection sub-module monitors performance of an MRI device controller during an MRI scanning procedure. The report sub-module provides MRI device controller performance information to the MRI pulse sequence controller to cause the MRI pulse sequence controller to modify the control data in response to predetermined MRI device controller performance information during the MRI scanning procedure.

For example, the performance of the MRI device controller during the MRI scanning procedure can include occurrence of a fatal error at the MRI device controller. In this case, the MRI device controller performance information can include notification of the fatal error.

In addition, the performance of the MRI device controller during the MRI scanning procedure can include the status of at least one designated performance parameter of the MRI device controller. For example, the designated performance parameter can be a scheduled repeating performance parameter, such as a periodic parameter. The designated performance parameter in this case can include timing of the scheduled repeating performance parameter. The performance monitor module can also include performance counters tracking occurrences of the performance parameter, and the designated performance parameter of the MRI device controller can include output values of the performance counters.

The performance parameter can include, for example, an interrupt to the pulse sequence data buffer. The interrupt can be a scheduled repeating interrupt, such as a periodic interrupt. The performance parameter of the MRI device controller can include the timing of the interrupt. The performance monitor module can also include performance counters tracking occurrences of the interrupt, and the designated performance parameter of the MRI device controller can include output values of the performance counters.

According to an embodiment of the performance monitor module, the detection sub-module determines that an error exists with respect to a monitored designated performance parameter, and the MRI pulse sequence controller repeats a portion of the MRI scan process corresponding to the determined error. The determined error can be, for example, a timing error. The portion of the MRI scan process corresponding to the determined error can include a predetermined number of sequences of the MRI scan process that occurred prior to determining that the error exists. The sequences of the MRI scan process can be, for example, numbers of outer phase encode levels. The MRI pulse sequence controller can delete MRI scan data corresponding to the determined error. The MRI pulse sequence controller can also replace MRI scan data corresponding to the determined error with MRI scan data obtained when repeating the portion of the MRI scan process corresponding to the determined error. In addition, the MRI pulse sequence controller can cause the MRI device controller to reset MRI scanner hardware. As an additional feature, the detection sub-module can count a number of errors that are determined during the MRI scan process, and the MRI pulse sequence controller can terminate the MRI scan process if the counted number of determined errors is equal to a predetermined error threshold.

According to another embodiment of the performance monitor module, the report sub-module sends an error message to the MRI scanning pulse sequence controller if timing of the at least one designated performance parameter varies from a parameter timing schedule by more than a designated tolerance. In this case, the MRI scanning pulse sequence controller can generate control data instructing a hardware reset in response to the error message, causing the MRI device controller to reset MRI scan process hardware. The MRI pulse sequence controller can include a counter that increments a sequence of the MRI scan process when no error message is received, and hold a count while the MRI device controller resets the MRI scan process hardware in response to the error message. Alternatively, the counter can decrement a predetermined number of counts while the MRI device controller resets the MRI scan process hardware.

The performance monitor module can include software that is executed by processor hardware. According to another aspect of the invention, a computer-readable medium can include this software. Alternatively, the performance monitor module can include a microprocessor, an ASIC, firmware, which can be stored on a ROM device, executed by processor hardware, or discrete circuitry and/or firmware mounted on a printed circuit board. The performance monitor module can be fabricated or assembled as a unit with the MRI device controller.

DETAILED DESCRIPTION OF THE INVENTION

Figure 1:
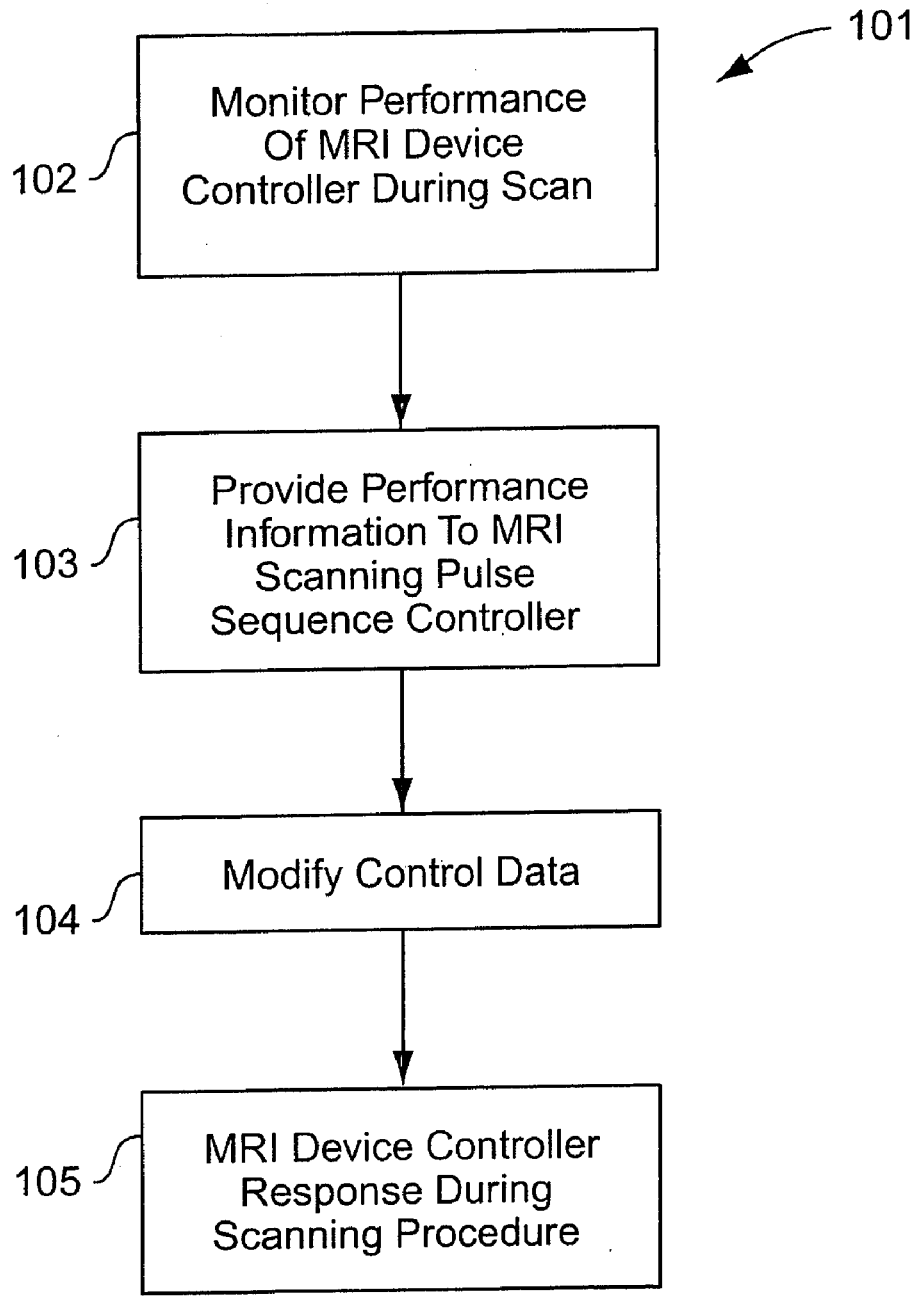
FIG. 1 is a flowchart illustrating an exemplary process of the present invention.

As shown in FIG. 1, an exemplary process for detecting and correcting errors in an MRI scan process 101 according to the invention includes monitoring performance of an MRI device controller during an MRI scanning procedure 102. MRI device controller performance information is provided to an MRI scanning pulse sequence controller 103. Control data generated by the MRI scanning pulse sequence controller is modified in response to the MRI device controller performance information 104. The MRI device controller responds to the modified control data during the MRI scanning procedure 105, affecting the functionality of the MRI devices. Thus, the correction response to the detected error takes place during the scanning procedure. If the error is not fatal, the scanning procedure can continue, and data collected after the error correction should provide artifact-free images.

Figure 2:
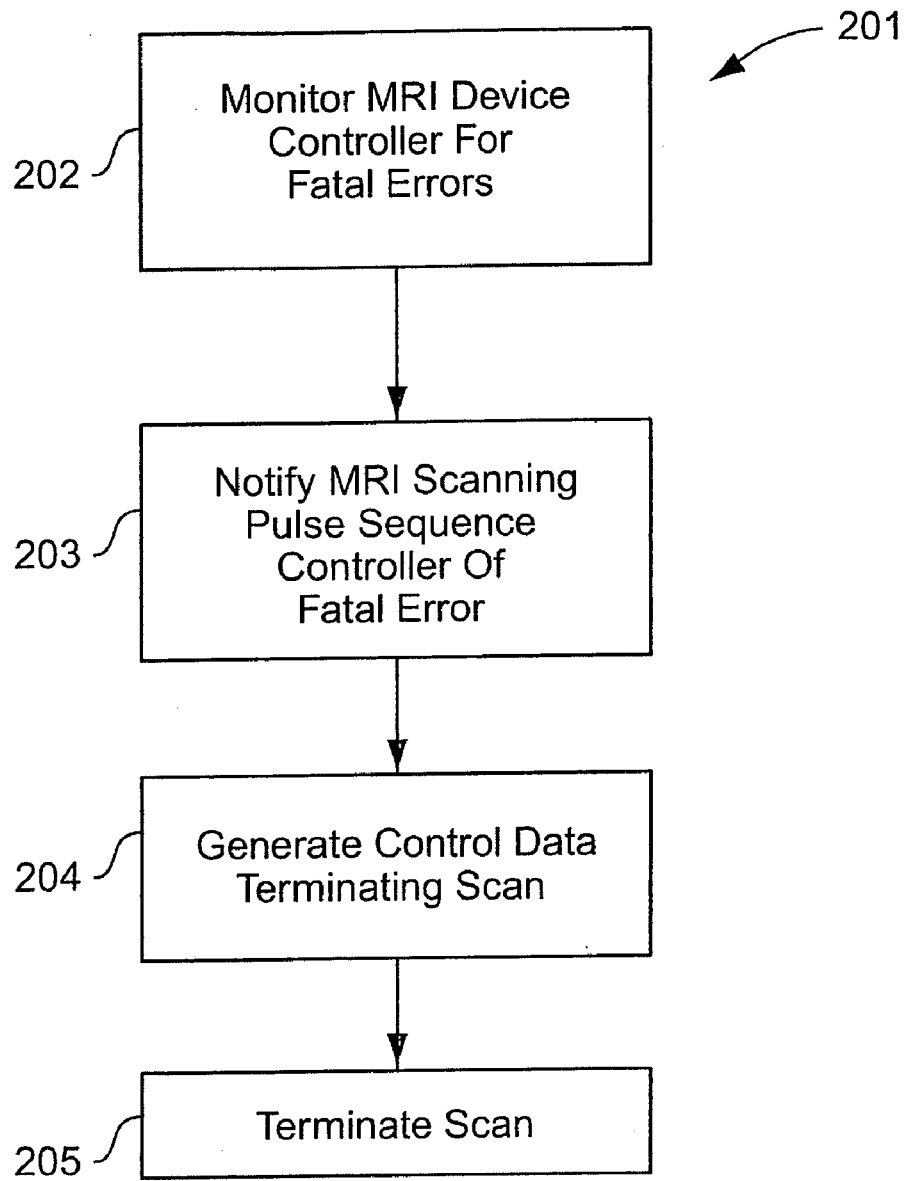
FIG. 2 is a flowchart illustrating an exemplary process of the present invention.

FIG. 2 shows another exemplary process for detecting and correcting errors in an MRI scan process 201 according to the invention. Fatal errors are monitored at the MRI device controller 202. The MRI scanning pulse sequence controller is notified that a fatal error has occurred 203. Control data terminating the MRI scanning procedure is generated 204, and the scanning procedure is terminated 205. Thus, according to this embodiment, monitoring the MRI device controller determines that a fatal error occurs, and the scanning procedure is terminated. Because the error is detected during the scanning procedure, energy resources and the patient's time are not wasted by continuing the scanning procedure after the occurrence of the fatal error.

Figure 3:
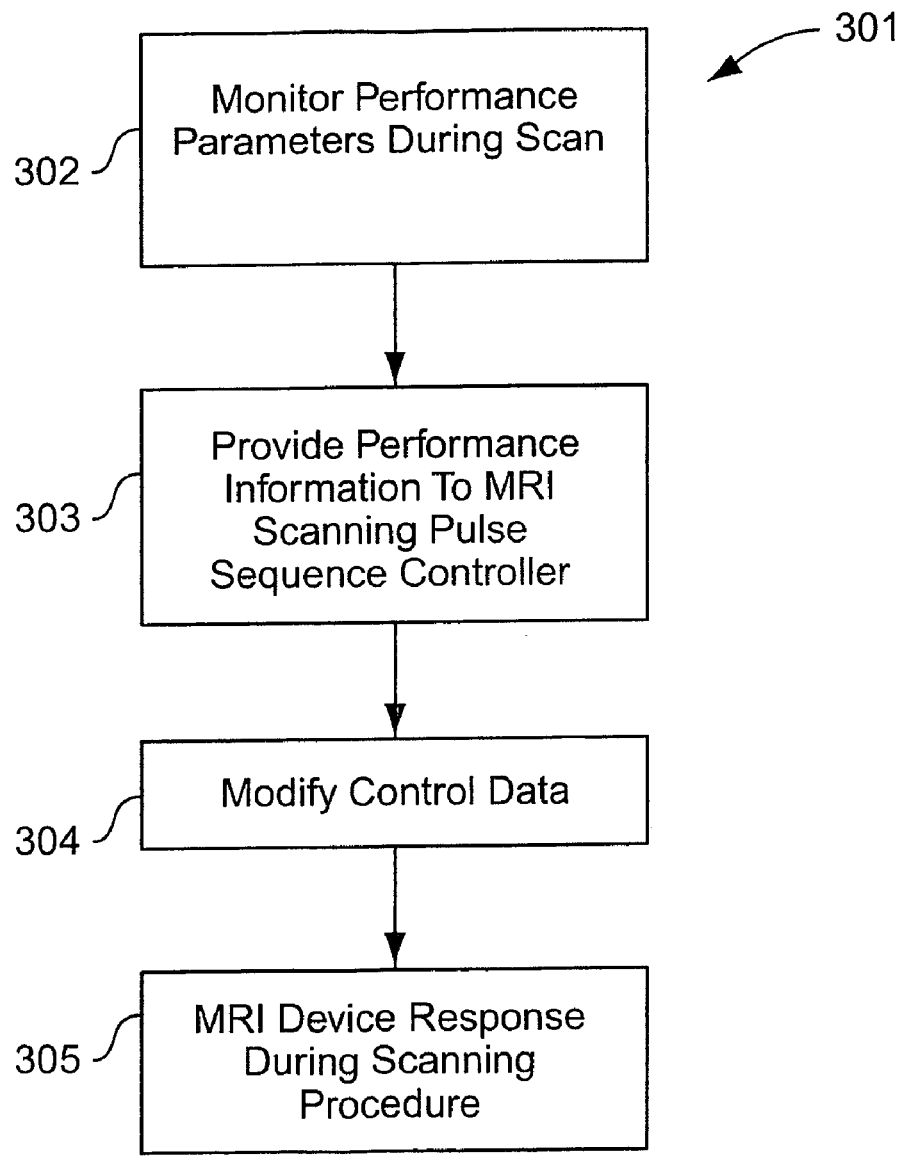
FIG. 3 is a flowchart illustrating an exemplary process of the present invention.

FIG. 3 shows another exemplary process for detecting and correcting errors in an MRI scan process 301 according to the invention. At least one designated performance parameter of the MRI device controller is monitored during the scanning process 302. This designated performance parameter can be, for example, a scheduled repeating performance parameter, such as a periodic parameter. The timing of the performance parameter can be monitored, or performance counters tracking occurrences of the performance parameter can be monitored.

One example of a performance parameter that can be monitored is an interrupt to a pulse sequence data buffer or other component of the MRI scan system. This interrupt can be a scheduled repeating interrupt, such as a periodic interrupt or an interrupt that repeats according to a non-periodic schedule. In this case, the timing of the interrupt or performance counters tracking occurrences of the interrupt can also be monitored.

Performance parameter information is provided to an MRI scanning pulse sequence controller 303. Control data generated by the MRI scanning pulse sequence controller is modified in response to the MRI device controller performance information 304. The MRI device controller responds to the modified control data during the MRI scanning procedure 305, affecting the functionality of the MRI devices. Thus, modifications to the control of the MRI devices are made in response to monitored performance parameters during the scanning procedure. This allows optimization of the scanning process and provides higher-quality images without repeating the scanning procedure.

Figure 4:
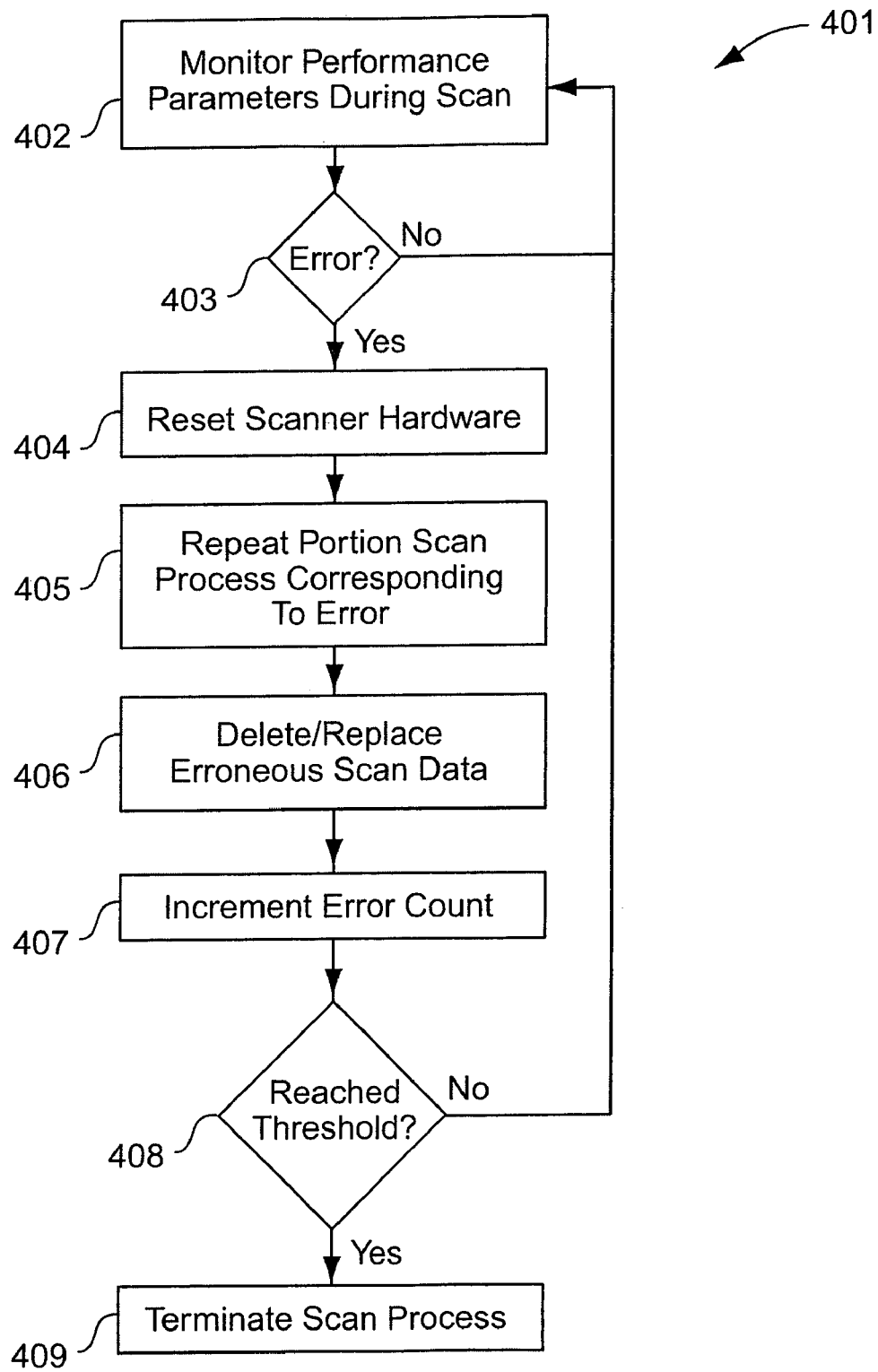
FIG. 4 is a flowchart illustrating an exemplary process of the present invention.

As shown in FIG. 4, a particular embodiment of the process of the invention 401 includes monitoring at least one designated performance parameter of the MRI device controller 402 during a normal scan sequence, and determining whether an error, such as a timing error, exists with respect to the monitored parameter 403. If an error is not detected, the normal scan sequence continues, along with continued monitoring. If an error is detected, the MRI scanner hardware is reset 404, and a portion of the MRI scan process corresponding to the determined error is repeated 405. The portion of the MRI scan process corresponding to the determined error can include a predetermined number of sequences of the MRI scan process that occurred prior to determining that the error exists. These sequences can be, for example, numbers of outer phase encode levels. In addition, MRI scan data corresponding to the determined error is deleted, or the MRI scan data corresponding to the determined error is replaced with MRI scan data obtained when repeating the portion of the MRI scan process corresponding to the determined error 406. As errors are detected, the number of errors detected during the MRI scan process is counted 407, and the MRI scan process is terminated 409 if the counted number of determined errors reaches or exceeds a predetermined error threshold 408. Thus, detected errors result in hardware resets, and erroneous data is replaced during the course of the scanning procedure. This eliminates the need to repeat the scanning procedure after an entire scan has been completed. Numerous errors over the course of a scan can indicate a fundamental error requiring termination of the procedure. However, the error-counting feature is optional.

Figure 5:
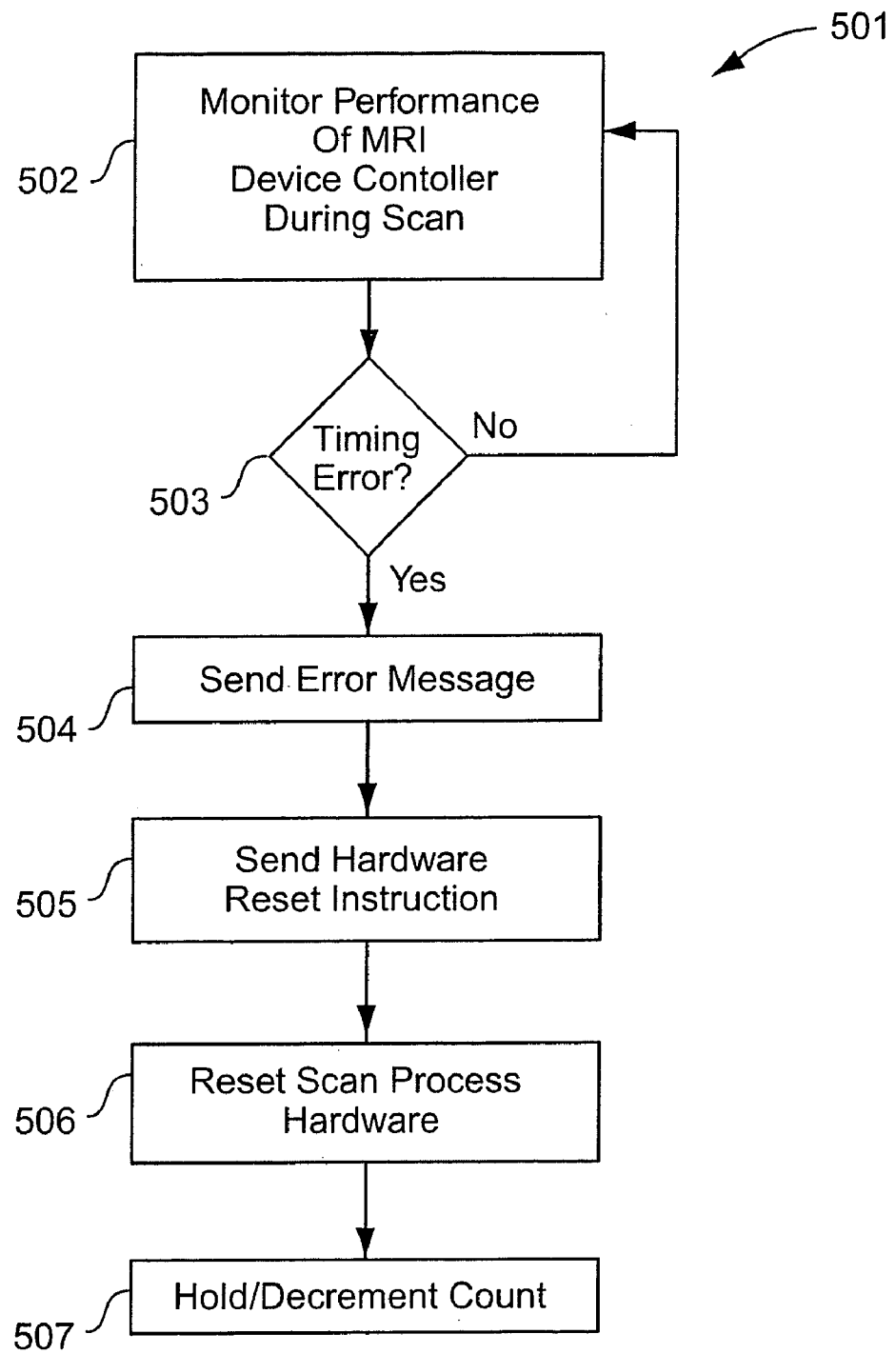
FIG. 5 is a flowchart illustrating an exemplary process of the present invention.

FIG. 5 shows an exemplary process for resetting the scanner hardware and replacing erroneous scan data 501. This process includes monitoring the performance of the MRI device controller during the scanning procedure 502, and determining if timing of the designated performance parameter varies from a parameter timing schedule by more than a designated tolerance 503. If so, an error message is sent to the MRI scanning pulse sequence controller 504. In response, the MRI scanning pulse sequence controller generates control data instructing a hardware reset 505, and the MRI device controller resets the MRI scan process hardware 506. A counter that increments a sequence of the MRI scan process will hold a count or decrement a predetermined number of counts while the MRI device controller resets the MRI scan process hardware 507. Thus, after the hardware reset, the scanning procedure will recommence at a point prior to the occurrence of the timing error, allowing for replacement of erroneous data that was previously captured.

Figure 6:
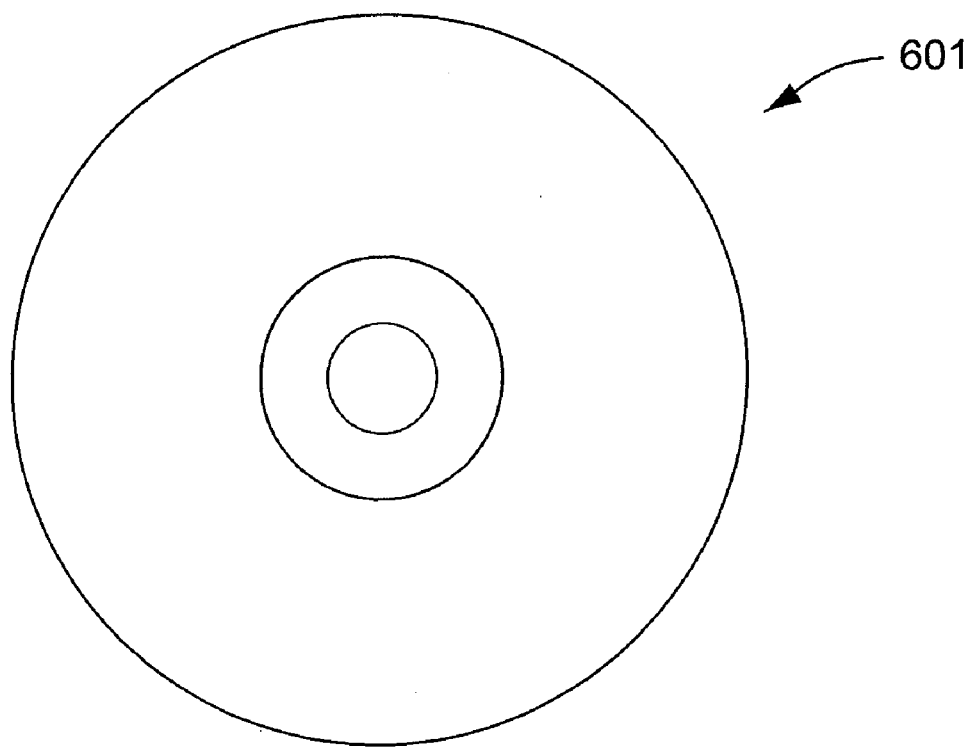
FIG. 6 is an illustration of an exemplary storage medium according to the present invention.

It is contemplated that, according to the present invention, a computer-readable medium can include instructions that are executable by a processor for causing a processor to carry out any of the processes described above. For example, a CD-ROM such as that shown in FIG. 6 can include instructions that can be executed by a PC functioning as or as part of a pulse sequence controller, or by an intermediate processor that is part of the MRI pulse sequence control system, or by distributed hardware of the system carrying out the actions of any of the above processes. This CD-ROM is only an example, and it is contemplated that any type of storage medium can be used.

Figure 7:
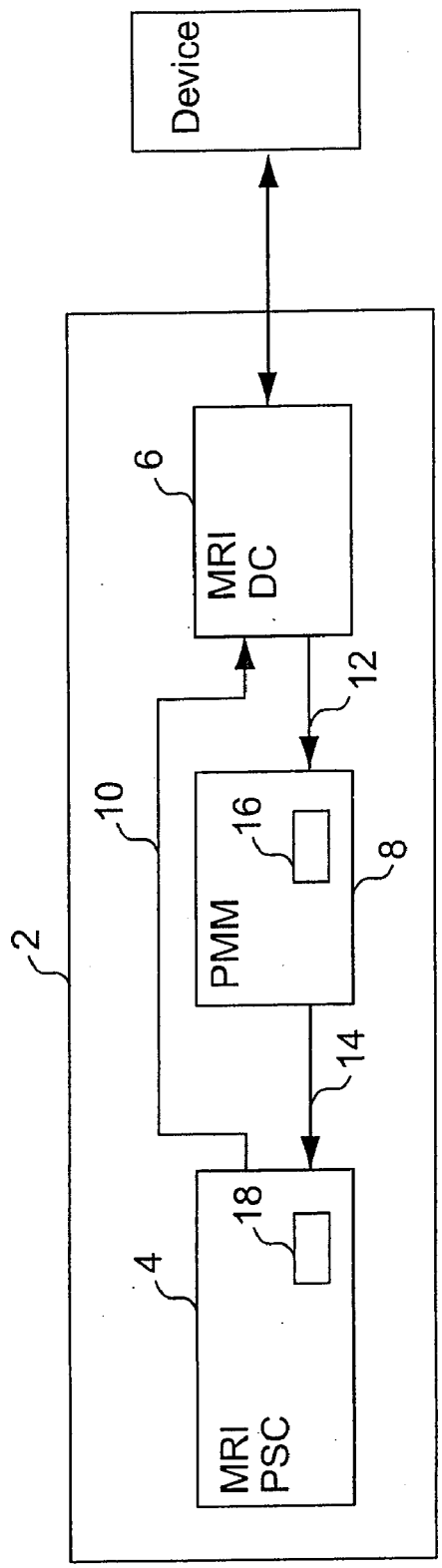
FIG. 7 is a block diagram of an exemplary MRI pulse sequence control system according to the present invention.

As shown in FIG. 7, an exemplary general embodiment of an MRI pulse sequence control system 2 of the present invention includes an MRI pulse sequence controller 4, an MRI device controller 6, and a performance monitor module 8. The MRI pulse sequence controller 4 generates pulse sequence control data 10 and provides the pulse sequence control data 10 to the MRI device controller 6. The MRI device controller 6 controls an MRI scanner device in accordance with the control data 10. The MRI device controller 6 provides performance data 12 to the performance monitor module 8 so that the performance monitor module 8 can monitor performance of the MRI device controller 6 during an MRI scanning procedure. After processing the performance data 12, the performance monitor module 8 provides MRI device controller performance information 14 to the MRI pulse sequence controller 4. The MRI pulse sequence controller 4 processes the MRI device controller performance information 14 and modifies the control data 10 in response, as necessary. The MRI device controller 6 responds to the modified control data 10 during the MRI scanning procedure.

For example, if the MRI device controller 6 experiences a fatal error during an MRI scan procedure, the performance data 12 will indicate the occurrence of the fatal error to the performance module 8. Information related to the fatal error 14 is provided to the MRI pulse sequence controller 4, which modifies the control data 10 accordingly, such as to request termination of the MRI scanning procedure. The MRI device controller 6 responds to the modified control data 10 by terminating the scanning procedure.

As another example, the MRI device controller 6 can provide, as the performance data 12, the status of at least one designated performance parameter of the MRI device controller 6. The designated performance parameter 12 can be, for example, a scheduled repeating performance parameter, which can occur periodically or according to a non-periodic schedule. The timing of this performance parameter 12 can also be monitored and processed by the performance monitor module 8, for comparison against the schedule. In an exemplary embodiment, the performance monitor module 8 includes performance counters 16 tracking occurrences of the performance parameter 12. These performance counters 16 can be, for example, software counters, or hardware counters such as digital circuit components. Output values of the performance counters can be processed by the performance monitor module 8 when generating the MRI device controller performance information 14.

When the performance monitor module 8 determines that a non-fatal error, such as a timing error, exists with respect to a monitored designated performance parameter 12, the MRI pulse sequence controller 4 repeats a portion of the MRI scan process corresponding to the determined error as directed by the MRI device controller performance information 14. For example, the MRI pulse sequence controller 4 can repeat a predetermined number of sequences, such as outer phase encode levels, of the MRI scan process that occurred prior to determining that the error exists. Alternatively, or in addition, the MRI pulse sequence controller 4 can delete MRI scan data corresponding to the determined error, or can replace MRI scan data corresponding to the determined error with MRI scan data obtained when repeating the portion of the MRI scan process corresponding to the determined error. The MRI pulse sequence controller 4 can also cause the MRI device controller 6 to reset MRI scanner hardware. Further, the performance monitor module 8 can count a number of errors that are determined during the MRI scan process, and the MRI pulse sequence controller 4 can terminate the MRI scan process if the counted number of determined errors is equal to a predetermined error threshold.

The performance monitor module 8 can send an error message 14 to the MRI scanning pulse sequence controller 4 if timing of the designated performance parameter 12 varies from a parameter timing schedule by more than a designated tolerance. In that case, the MRI scanning pulse sequence controller 4 generates control data 10 instructing a hardware reset in response to the error message 14, causing the MRI device controller 6 to reset MRI scan process hardware. The MRI pulse sequence controller 4 can include a counter 18 that increments a sequence of the MRI scan process when no error message is received, and holds a count while the MRI device controller 6 resets the MRI scan process hardware in response to the error message. Alternatively, the counter 18 can decrement a predetermined number of counts while the MRI device controller 6 resets the MRI scan process hardware.

In a particular embodiment, the MRI pulse sequence controller 4 is a component of a personal computer, which includes a microprocessor, an ASIC, software that is executed by processor hardware, or firmware executed by processor hardware. The firmware can be stored, for example, on a ROM device that is part of or in communication with the personal computer. Likewise, the performance monitor module 8 can include a microprocessor, an ASIC, software that is executed by processor hardware, or firmware executed by processor hardware. The firmware can be stored, for example, on an associated ROM device. Further, the performance monitor module 8 can be fabricated or assembled as a unit with the MRI device controller 6, or can be a separate unit.

Figure 8:
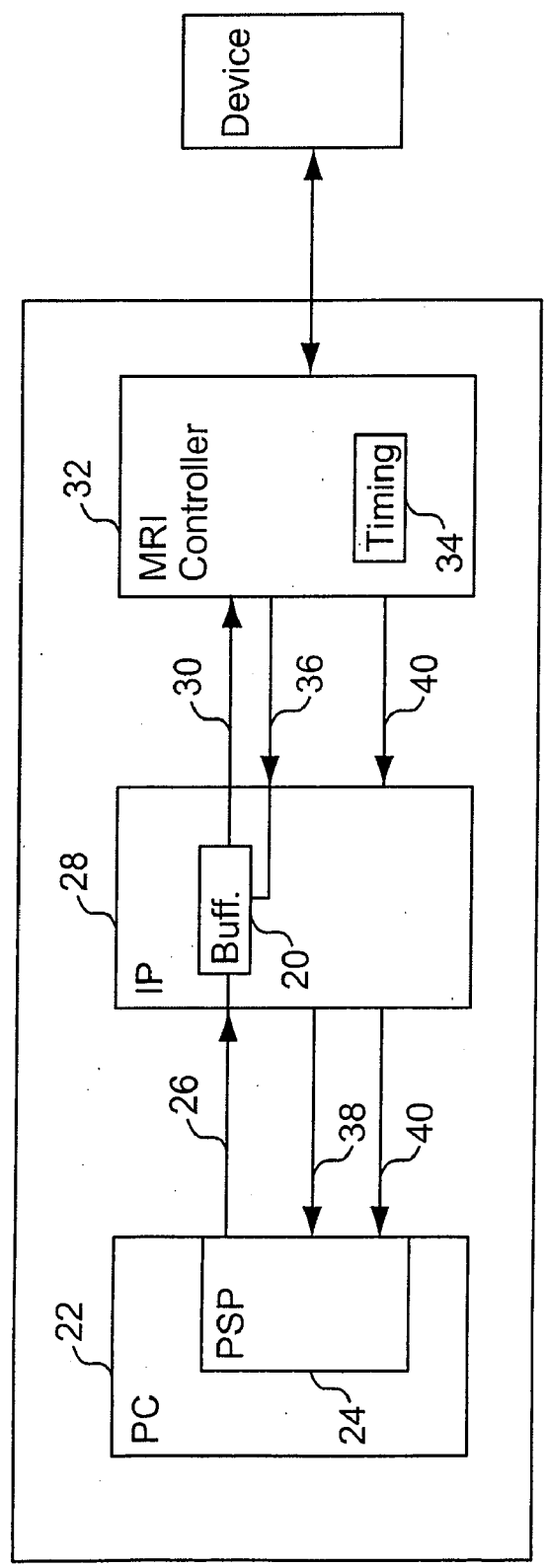
FIG. 8 is a block diagram of an exemplary MRI pulse sequence control system according to the present invention.

An exemplary embodiment of the system of the present invention is shown in FIG. 8. As shown, a PC 22 running a pulse sequence program 24 generates a stream of control data 26 and provides this control data to an intermediate processor 28, such as an Intel® 960 processor. The intermediate processor 28 includes data buffers 20 that buffer the control data 26 stream, and the intermediate processor 28 then provides blocks of the control data 30 to an MRI controller 32, which provides the control data 30 to various MRI devices according to timing logic 34.

The timing of the control data transfer between the intermediate processor 28 and the MRI controller 32 is determined by interrupts 36 generated by the MRI controller 32. Mistiming in the generation of these data transfer interrupts 36 results in improper MRI device functionality, which in turn causes image artifacts. The intermediate processor 28 includes firmware that detects any interrupt discrepancy and notifies the pulse sequence program 24 running on the PC 22 by sending an error status message 38. The pulse sequence program 24 responds to the error notification by sending control data 26 to reset the MRI devices and continuing the scanning procedure at the point or just before the point at which the error occurred.

In summary, pulse sequence control data 26 used to control the functionality of MRI devices is generated by a pulse sequence program 24 running on the PC 22, and provided first to the intermediate processor 28, and then to the MRI controller 32 according to interrupt 36 timing. Signal data 40 from MRI scanner devices and status messages 38 are sent from the intermediate processor 28 to the pulse sequence program 24. If the intermediate processor 28 detects a timing discrepancy with the interrupts 36 received from the MRI controller 32, the intermediate processor 28 sends an error status message 38 to the PC 22, to be processed by the pulse sequence program 24. Thus, the point in the scanning procedure at which the signal data has become unreliable is determined, so that the MRI devices can be reset and the scanning procedure can be continued automatically from that point or earlier.

Functions of the pulse sequence program 24 send the control data 26 to the intermediate processor 28, respond to the status messages 38, and collect the signal data 40. The pulse sequence program 24 includes a counter variable that is advanced when valid status messages 38, that is, status messages not indicating a re-settable error, are received from the intermediate processor 28. By counting the number of valid status messages 38, the counter variable indicates the number of outer phase encode levels that have been successfully completed during the scanning procedure. On detection of an interrupt error, the counter variable suspends the counting action while the MRI devices are reset. An error-handling function of the pulse sequence program 24 passes a flag to the reset function of the MRI controller 32 to indicate that the scan should continue after the reset, without resetting the counter variable, as long as a valid status message 38 is received. If an interrupt timing error is detected, the scanning procedure is reset and the outer phase encode level corresponding to the erroneous count is repeated. The pulse sequence program 24 also stops the scanning procedure if the number of resets exceeds a predetermined threshold. Another parameter of the pulse sequence program 24 controls the number of levels to repeat prior to the level corresponding to the erroneous count, to provide additional assurance that unreliable data is replaced.

According to the present invention, a performance monitor module can be adapted for use in an MRI pulse sequence control system that includes an MRI pulse sequence controller similar to any of those described above. As previously described, the MRI pulse sequence controller generates pulse sequence control data for an MRI device controller that controls MRI scanner devices in accordance with the control data.

Figure 9:
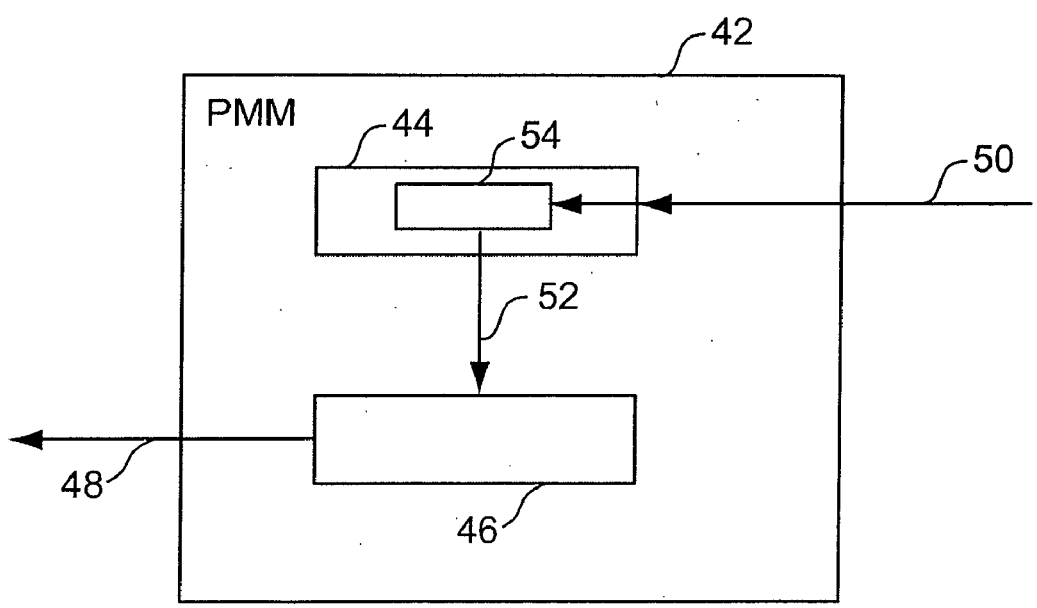
FIG. 9 is a block diagram of an exemplary performance monitor module according to the present invention.

As shown in FIG. 9, the performance monitor module 42 includes a detection sub-module 44 and a report sub-module 46. The detection sub-module 44 monitors a performance parameter 50 of the MRI device controller during an MRI scanning procedure, processes the parameter data, and provides the processed data 52 to the report sub-module 46. The report sub-module 46 provides MRI device controller performance information 48 to the MRI pulse sequence controller. The report sub-module 46 also directs the MRI pulse sequence controller to modify the pulse sequence control data in response to the MRI device controller performance information 48 during the MRI scanning procedure.

For example, the performance parameter 50 can indicate the occurrence of a fatal error at the MRI device controller. In this case, the report sub-module 46 can provide MRI device controller performance information 48 including notice of the fatal error.

The designated performance parameter 50 can be a scheduled repeating performance parameter, which can be a periodic parameter or a parameter that repeats according to a non-periodic schedule. The detection sub-module 44 can also monitor the timing of the scheduled repeating performance parameter, for example by including performance counters 54 tracking occurrences of the performance parameter 50, and the processed data 52 can include output values of the performance counters 54. For example, the performance parameter 50 monitored by the detection sub-module 44 can be an interrupt to the pulse sequence data buffer. The detection sub-module 44 can also monitor the timing of the interrupt.

Thus, the detection sub-module 44 determines that an error exists with respect to the monitored designated performance parameter 50, and the report sub-module 46 reports the error to the MRI pulse sequence controller, which repeats a portion of the MRI scan process corresponding to the determined error, such as a predetermined number of sequences of the MRI scan process that occurred prior to determining that the error exists. The performance monitor module 42 can cause the MRI pulse sequence controller to delete MRI scan data corresponding to the determined error, and to replace MRI scan data corresponding to the determined error with MRI scan data obtained when repeating the portion of the MRI scan process corresponding to the determined error. In addition, the performance monitor module 42 can instruct the MRI pulse sequence controller to cause the MRI device controller to reset the MRI scanner hardware. As an additional feature, the detection sub-module 44 can count a number of errors that are determined during the MRI scan process, and the performance monitor module 42 can instruct the MRI pulse sequence controller to terminate the MRI scan process if the counted number of determined errors exceeds a predetermined error threshold.

According to another embodiment of the performance monitor module 42, the report sub-module 46 sends an error message to the MRI scanning pulse sequence controller if the detection sub-module detects that the timing of the designated performance parameter varies from a parameter timing schedule by more than a designated tolerance. In this case, the performance monitor module 42 can instruct the MRI scanning pulse sequence controller to generate control data instructing a hardware reset in response to the error message, causing the MRI device controller to reset MRI scan process hardware.

The performance monitor module 42 can include software that is executed by processor hardware that is also included in the module. The software can be pre-loaded on the processor, or a computer-readable medium can include this software. Alternatively, the performance monitor module 42 can include a microprocessor, an ASIC, or firmware, which can be stored on a ROM device, executed by processor hardware.

Particular exemplary embodiments of the present invention have been described in detail. These exemplary embodiments are illustrative of the inventive concept recited in the appended claims, and are not limiting of the scope or spirit of the present invention as contemplated by the inventors.

The invention claimed is:

1. A process for detecting and correcting errors in an MRI scan process, comprising:
    monitoring performance of an MRI device controller during an MRI scanning procedure;
    providing MRI device controller performance information to an MRI scanning pulse sequence controller;
    modifying control data generated by the MRI scanning pulse sequence controller in response to the MRI device controller performance information; and
    responding to the modified control data at the MRI device controller during the MRI scanning procedure.

2. The process of claim 1, wherein the MRI scanning pulse sequence controller includes a software module.

3. The process of claim 1, wherein monitoring performance of the MRI device controller during the MRI scanning procedure includes monitoring fatal errors at the MRI device controller.

4. The process of claim 3, wherein providing MRI device controller performance information to the MRI scanning pulse sequence controller includes notifying the MRI scanning pulse sequence controller that a fatal error has occurred.

5. The process of claim 4, wherein modifying the control data includes generating control data terminating the MRI scanning procedure.

6. The process of claim 5, wherein responding to the modified control data includes terminating the scanning procedure.

7. The process of claim 1, wherein the monitored performance is data transfer accuracy of the MRI device controller.

8. The process of claim 7, wherein monitoring performance of the MRI device controller during the MRI scanning procedure includes monitoring at least one designated performance parameter of the MRI device controller.

9. The process of claim 8, wherein the designated performance parameter is a scheduled repeating performance parameter.

10. The process of claim 9, wherein the scheduled repeating performance parameter is a periodic parameter.

11. The process of claim 9, wherein monitoring the at least one designated performance parameter of the MRI device controller includes monitoring the timing of the performance parameter.

12. The process of claim 9, wherein monitoring the at least one designated performance parameter of the MRI device controller includes monitoring performance counters tracking occurrences of the performance parameter.

13. The process of claim 8, wherein the at least one performance parameter includes an interrupt to a pulse sequence data buffer.

14. The process of claim 13, wherein the interrupt is a scheduled repeating interrupt.

15. The process of claim 14, wherein the scheduled repeating interrupt is a periodic interrupt.

16. The process of claim 13, wherein monitoring the at least one designated performance parameter of the MRI device controller includes monitoring the timing of the interrupt.

17. The process of claim 13, wherein monitoring the at least one designated performance parameter of the MRI device controller includes monitoring performance counters tracking occurrences of the interrupt.

18. The process of claim 8, further comprising:
determining that an error exists with respect to a monitored designated performance parameter; and
repeating a portion of the MRI scan process corresponding to the determined error.

19. The process of claim 18, wherein the portion of the MRI scan process corresponding to the determined error includes a predetermined number of sequences of the MRI scan process that occurred prior to determining that the error exists.

20. The process of claim 19, wherein the sequences of the MRI scan process are numbers of outer phase encode levels.

21. The process of claim 18, further comprising deleting MRI scan data corresponding to the determined error.

22. The process of claim 18, further comprising replacing MRI scan data corresponding to the determined error with MRI scan data obtained when repeating the portion of the MRI scan process corresponding to the determined error.

23. The process of claim 18, wherein the determined error is a timing error.

24. The process of claim 18, further comprising causing the MRI device controller to reset MRI scanner hardware.

25. The process of claim 18, further comprising counting a number of errors that are determined during the MRI scan process.

26. The process of claim 25, further comprising terminating the MRI scan process if the counted number of determined errors is equal to a predetermined error threshold.

27. The process of claim 8, wherein providing MRI device controller performance information to the MRI scanning pulse sequence controller includes sending an error message to the MRI scanning pulse sequence controller if timing of the at least one designated performance parameter varies from a parameter timing schedule by more than a designated tolerance.

28. The process of claim 27, wherein
modifying the control data generated by the MRI scanning pulse sequence controller in response to the MRI device controller performance information includes causing the MRI scanning pulse sequence controller to generate control data instructing a hardware reset, and
responding to the modified control data includes causing the MRI device controller to reset MRI scan process hardware.

29. The process of claim 28, further comprising causing a counter that increments a sequence of the MRI scan process to hold a count while the MRI device controller resets the MRI scan process hardware.

30. The process of claim 28, further comprising causing a counter that increments a sequence of the MRI scan process to decrement a predetermined number of counts while the MRI device controller resets the MRI scan process hardware.

31. A computer-readable medium, comprising instructions that are executable by a processor for causing the processor to carry out the process of claim 1.

32. The process of claim 1, wherein the monitored performance is signal data reliability of the MRI device controller.

33. The process of claim 1, wherein the performance of the MRI device controller is monitored directly.

34. The process of claim 1, wherein the MRI scanning procedure is performed on a subject patient.

35. The process of claim 1, wherein modifying control data includes modifying a process for generating the control data.

36. An MRI pulse sequence control system, comprising:
an MRI pulse sequence controller that generates pulse sequence control data;
an MRI device controller that controls MRI scanner devices in accordance with the control data; and
a performance monitor module that monitors performance of the MRI device controller during an MRI scanning procedure and provides MRI device controller performance information to the MRI pulse sequence controller;
wherein the MRI pulse sequence controller modifies the control data in response to the MRI device controller performance information; and
wherein the MRI device controller responds to the modified control data during the MRI scanning procedure.

37. The system of claim 36, wherein the performance of the MRI device controller during the MRI scanning procedure includes occurrence of a fatal error at the MRI device controller.

38. The system of claim 37, wherein the MRI device controller performance information includes notification of the fatal error.

39. The system of claim 38, wherein the modified control data includes control data requesting termination of the MRI scanning procedure.

40. The system of claim 39, wherein the MRI device controller responds to the modified control data by terminating the scanning procedure.

41. The system of claim 36, wherein the monitored performance is data transfer accuracy of the MRI device controller.

42. The system of claim 41, wherein the performance of the MRI device controller during the MRI scanning procedure includes the status of at least one designated performance parameter of the MRI device controller.

43. The system of claim 42, wherein the designated performance parameter is a scheduled repeating performance parameter.

44. The system of claim 43, wherein the scheduled repeating performance parameter is a periodic parameter.

45. The system of claim 43, wherein the designated performance parameter includes timing of the scheduled repeating performance parameter.

46. The system of claim 45, wherein the performance monitor module includes performance counters tracking occurrences of the performance parameter.

47. The system of claim 46, wherein the at least one designated performance parameter of the MRI device controller includes output values of the performance counters.

48. The system of claim 42, further including a pulse sequence data buffer, wherein the at least one performance parameter includes an interrupt to the pulse sequence data buffer.

49. The system of claim 48, wherein the interrupt is a scheduled repeating interrupt.

50. The system of claim 49, wherein the scheduled repeating interrupt is a periodic interrupt.

51. The system of claim 48, wherein the at least one designated performance parameter of the MRI device controller includes the timing of the interrupt.

52. The system of claim 48, wherein the performance monitor module includes performance counters tracking occurrences of the interrupt.

53. The system of claim 52, wherein the at least one designated performance parameter of the MRI device controller includes output values of the performance counters.

54. The system of claim 36, wherein the performance monitor module determines that an error exists with respect to a monitored designated performance parameter, and the MRI pulse sequence controller repeats a portion of the MRI scan process corresponding to the determined error.

55. The system of claim 54, wherein the portion of the MRI scan process corresponding to the determined error includes a predetermined number of sequences of the MRI scan process that occurred prior to determining that the error exists.

56. The system of claim 55, wherein the sequences of the MRI scan process are numbers of outer phase encode levels.

57. The system of claim 54, wherein the MRI pulse sequence controller deletes MRI scan data corresponding to the determined error.

58. The system of claim 54, wherein the MRI pulse sequence controller replaces MRI scan data corresponding to the determined error with MRI scan data obtained when repeating the portion of the MRI scan process corresponding to the determined error.

59. The system of claim 54, wherein the determined error is a timing error.

60. The system of claim 54, wherein the MRI pulse sequence controller causes the MRI device controller to reset MRI scanner hardware.

61. The system of claim 54, wherein the performance monitor module counts a number of errors that are determined during the MRI scan process.

62. The system of claim 61, wherein the MRI pulse sequence controller terminates the MRI scan process if the counted number of determined errors is equal to a predetermined error threshold.

63. The system of claim 36, wherein the performance monitor module sends an error message to the MRI scanning pulse sequence controller if timing of the at least one designated performance parameter varies from a parameter timing schedule by more than a designated tolerance.

64. The system of claim 63, wherein the MRI scanning pulse sequence controller generates control data instructing a hardware reset in response to the error message, causing the MRI device controller to reset MRI scan process hardware.

65. The system of claim 64, wherein the MRI pulse sequence controller includes a counter that increments a sequence of the MRI scan process when no error message is received, and holds a count while the MRI device controller resets the MRI scan process hardware in response to the error message.

66. The system of claim 64, wherein the MRI pulse sequence controller includes a counter that increments a sequence of the MRI scan process when no error message is received, and decrements a predetermined number of counts while the MRI device controller resets the MRI scan process hardware.

67. The system of claim 36, wherein the MRI pulse sequence controller is a component of a personal computer.

68. The system of claim 36, wherein the MRI pulse sequence controller includes a microprocessor.

69. The system of claim 36, wherein the MRI pulse sequence controller includes at least one of an application-specific integrated circuit and a field-programmable gate array.

70. The system of claim 36, wherein the MRI pulse sequence controller includes firmware executed by processor hardware.

71. The system of claim 70, wherein the firmware is stored on a ROM device.

72. The system of claim 36, wherein the MRI pulse sequence controller includes software that is executed by processor hardware.

73. The system of claim 36, wherein the performance monitor module includes a microprocessor.

74. The system of claim 36, wherein the performance monitor module includes an ASIC.

75. The system of claim 36, wherein the performance monitor module includes firmware executed by processor hardware.

76. The system of claim 75, wherein the firmware is stored on a ROM device.

77. The system of claim 36, wherein the performance monitor module includes software that is executed by processor hardware.

78. The system of claim 36, wherein the performance monitor module is fabricated as a unit with the MRI device controller.

79. The system of claim 36, further comprising an intermediate processor that passes control data from the MRI pulse sequence controller to the MRI device controller.

80. The system of claim 79, wherein the intermediate processor passes the MRI device controller performance information to the MRI pulse sequence controller.

81. The system of claim 80, wherein the intermediate processor includes data buffers that buffer at least some data passing between the MRI pulse sequence controller and the MRI device controller.

82. The system of claim 79, wherein the performance monitor module is fabricated as a unit with the intermediate processor.

83. The system of claim 36, wherein the monitored performance is signal data reliability of the MRI device controller.

84. The system of claim 36, wherein the performance monitor module directly monitors the performance of the MRI device controller.

85. The system of claim 36, wherein the MRI scanning procedure is performed on a subject patient.

86. The system of claim 36, wherein the MRI pulse sequence controller modifies the control data by modifying a process for generating the control data.

87. A performance monitor module for use in an MRI pulse sequence control system that includes an MRI pulse sequence controller that generates pulse sequence control data and an MRI device controller that controls MRI scanner devices in accordance with the control data, the performance monitor module comprising:
   a detection sub-module that monitors performance of an MRI device controller during an MRI scanning procedure; and
   a report sub-module that provides MRI device controller performance information to the MRI pulse sequence controller to cause the MRI pulse sequence controller to modify the control data in response to predetermined MRI device controller performance information during the MRI scanning procedure.

88. The module of claim 87, wherein the performance of the MRI device controller during the MRI scanning procedure includes occurrence of a fatal error at the MRI device controller.

89. The module of claim 88, wherein the MRI device controller performance information includes notification of the fatal error.

90. The module of claim 87, wherein the monitored performance is data transfer accuracy of the MRI device controller.

91. The module of claim 90, wherein the performance of the MRI device controller during the MRI scanning procedure includes the status of at least one designated performance parameter of the MRI device controller.

92. The module of claim 91, wherein the designated performance parameter is a scheduled repeating performance parameter.

93. The module of claim 92, wherein the scheduled repeating performance parameter is a periodic parameter.

94. The module of claim 92, wherein the designated performance parameter includes timing of the scheduled repeating performance parameter.

95. The module of claim 92, further comprising performance counters tracking occurrences of the performance parameter.

96. The module of claim 95, wherein the at least one designated performance parameter of the MRI device controller includes output values of the performance counters.

97. The module of claim 91, wherein the at least one performance parameter includes an interrupt to the pulse sequence data buffer.

98. The module of claim 97, wherein the interrupt is a scheduled repeating interrupt.

99. The module of claim 98, wherein the scheduled repeating interrupt is a periodic interrupt.

100. The module of claim 97, wherein the at least one designated performance parameter of the MRI device controller includes timing of the interrupt.

101. The module of claim 97, further comprising performance counters tracking occurrences of the interrupt.

102. The module of claim 101, wherein the at least one designated performance parameter of the MRI device controller includes output values of the performance counters.

103. The module of claim 87, wherein the detection sub-module determines that an error exists with respect to a monitored designated performance parameter, and the report sub-module directs the MRI pulse sequence controller to repeat a portion of the MRI scan process corresponding to the determined error.

104. The module of claim 103, wherein the portion of the MRI scan process corresponding to the determined error includes a predetermined number of sequences of the MRI scan process that occurred prior to determining that the error exists.

105. The module of claim 104, wherein the sequences of the MRI scan process are numbers of outer phase encode levels.

106. The module of claim 103, wherein the report sub-module directs the MRI pulse sequence controller to delete MRI scan data corresponding to the determined error.

107. The module of claim 103, wherein the report sub-module directs the MRI pulse sequence controller to replace MRI scan data corresponding to the determined error with MRI scan data obtained when repeating the portion of the MRI scan process corresponding to the determined error.

108. The module of claim 103, wherein the determined error is a timing error.

109. The module of claim 103, wherein the report sub-module directs the MRI pulse sequence controller to cause the MRI device controller to reset MRI scanner hardware.

110. The module of claim 103, wherein the detection sub-module counts a number of errors that are determined during the MRI scan process.

111. The module of claim 110, wherein the report sub-module directs the MRI pulse sequence controller to terminate the MRI scan process if the counted number of determined errors is equal to a predetermined error threshold.

112. The module of claim 87, wherein the report sub-module sends an error message to the MRI scanning pulse sequence controller if timing of the at least one designated performance parameter varies from a parameter timing schedule by more than a designated tolerance.

113. The module of claim 90, wherein the report sub-module directs the MRI scanning pulse sequence controller to generate control data instructing a hardware reset in response to the error message, causing the MRI device controller to reset MRI scan process hardware.

114. The module of claim 113, further comprising a counter that increments a sequence of the MRI scan process when no error message is received, and holds a count while the MRI device controller resets the MRI scan process hardware in response to the error message.

115. The module of claim 113, further comprising a counter that increments a sequence of the MRI scan process when no error message is received, and decrements a predetermined number of counts while the MRI device controller resets the MRI scan process hardware.

116. The module of claim 87, comprising software that is executed by processor hardware.

117. A computer-readable medium, comprising the performance monitor module of claim 116.

118. The module of claim 87, comprising a microprocessor.

119. The module of claim 87, comprising an ASIC.

120. The module of claim 87, comprising firmware executed by processor hardware.

121. The module of claim 120, wherein the firmware is stored on a ROM device.

122. The module of claim 87, fabricated as a unit with the MRI device controller.

123. The module of claim 87, wherein the monitored performance is signal data reliability of the MRI device controller.

124. The module of claim 87, wherein the detection sub-module directly monitors the performance of the MRI device controller.

125. The module of claim 87, wherein the MRI scanning procedure is performed on a subject patient.

126. The module of claim 87, wherein the MRI pulse sequence controller is caused to modify the control data by modifying a process for generating the control data.

* * * * *